(12) United States Patent
Hung

(10) Patent No.: US 7,692,905 B2
(45) Date of Patent: Apr. 6, 2010

(54) ELECTROSTATIC DISCHARGE PROTECTION CIRCUIT FOR OUTPUT BUFFER

(75) Inventor: Kenneth Wai Ming Hung, Hong Kong (HK)

(73) Assignee: Smartech Worldwide Limited, Hong Kong (CN)

( * ) Notice: Subject to any disclaimer, the term of this patent is extended or adjusted under 35 U.S.C. 154(b) by 799 days.

(21) Appl. No.: 11/564,052

(22) Filed: Nov. 28, 2006

(65) Prior Publication Data

US 2008/0123228 A1    May 29, 2008

(51) Int. Cl.
*H02H 9/00* (2006.01)
(52) U.S. Cl. .................................. 361/56; 361/111
(58) Field of Classification Search .................. 361/56, 361/91.1, 111, 117–118; 327/112, 313, 318
See application file for complete search history.

(56) References Cited

U.S. PATENT DOCUMENTS

| | | | |
|---|---|---|---|
| 4,990,802 A | 2/1991 | Smooha | |
| 5,157,573 A | 10/1992 | Lee | |
| 5,239,440 A * | 8/1993 | Merrill | 361/56 |
| 5,345,357 A | 9/1994 | Pianka | |
| 5,463,520 A | 10/1995 | Nelson | |
| 5,559,659 A | 9/1996 | Strauss | |
| 5,617,283 A | 4/1997 | Krakauer | |
| 5,729,419 A | 3/1998 | Lien | |
| 5,745,323 A | 4/1998 | English | |
| 5,754,380 A * | 5/1998 | Ker et al. | 361/56 |
| 5,754,381 A | 5/1998 | Ker | |
| 5,825,601 A | 10/1998 | Statz | |
| 5,978,192 A | 11/1999 | Young | |
| 6,043,967 A | 3/2000 | Lin | |
| 6,069,782 A | 5/2000 | Lien | |
| 6,091,593 A | 7/2000 | Lin | |
| 6,522,511 B1 | 2/2003 | John | |
| 6,529,035 B2 * | 3/2003 | Schroeder et al. | 326/26 |
| 6,529,359 B1 | 3/2003 | Verhaege | |
| 6,538,868 B2 | 3/2003 | Chang | |
| 6,545,520 B2 * | 4/2003 | Maloney et al. | 327/313 |
| 6,690,561 B2 | 2/2004 | Hung | |
| 6,826,026 B2 * | 11/2004 | Duvvury et al. | 361/56 |
| 6,919,602 B2 | 7/2005 | Lin | |
| 7,580,233 B2 * | 8/2009 | Davis | 361/56 |

* cited by examiner

*Primary Examiner*—Jared J Fureman
*Assistant Examiner*—Terrence R Willoughby
(74) *Attorney, Agent, or Firm*—Xin Wen

(57) ABSTRACT

An electrostatic discharge protection circuit for an electronic device includes an output buffer including a transistor having a gate configured to receive a control signal, a source connected to a voltage supply terminal, and a drain connected to a pad; and an ESD trigger circuit configured to produce a first electronic signal in response to an electrostatic voltage between the pad or the voltage supply terminal. The first electronic signal can isolate the control signal from the gate of the transistor and to turn on the transistor to discharge the electrostatic voltage between the pad and the voltage supply terminal.

20 Claims, 4 Drawing Sheets

US 7,692,905 B2

ELECTROSTATIC DISCHARGE PROTECTION CIRCUIT FOR OUTPUT BUFFER

BACKGROUND

The present disclosure relates to an electrostatic discharge (ESD) protection circuit.

Electrostatic discharge is an event that can occur during device fabrication, assembly packaging, or device handling. During a typical ESD event, a large amount of charge is accumulated in a bonding pad of an integrated circuit. If the charges develop a high voltage that the chip cannot tolerate, a fatal discharge may happen inside the chip to cause the chip malfunction.

Most of the time, the bonding pin of the integrated circuit (IC) is the first and nearest component to interact with outside environment. The ESD protection circuit is therefore commonly placed around the bonding pins and more specifically around the IO ring of the integrated circuit. The input/output buffer is the first circuit component to connect to the bonding pins to provide interaction between internal circuit core and the outside environment. Thus, it is very important that the input and output buffers can withstand ESD events.

FIG. 1 illustrates a conventional ESD protection circuit 100 for output buffer. The ESD protection circuit 100 includes a pre-driver 101, an output buffer 102, and a circuit 103. The output buffer 102 includes a P-Channel MOSFET transistor P1 and an N-Channel MOSFET transistor N1. Two supply terminals VDD and VSS are respectively held at voltages VDD and VSS. The pre-driver 101 can provide logic functions to turn on/off the output buffer 102. One of the pre-driver implementation just consists of two inverters, respectively to buffer the output transistors. In order to turn on P-Channel MOSFET transistor P1, the logic level of PRE_PUP will be high and PUP will then be low. When PRE_NDN is low, NDN will be high after the inverter and thus turn on the N-Channel MOSFET transistor N1. Circuit 103 includes ESD clamping diodes 110 and 111.

The parasitic diodes 120 and 121 respectively associated with the transistors P1 and N1 can function as discharging diodes. During an ESD event zapping from pad 140 to VDD, positive charges can accumulate at the pad 140 and/or a negative charge can be stored at the VDD terminal. Once the electrostatic voltage developed is above the threshold of the parasitic diode 120, a discharging path is formed to allow ESD current to flow from the pad 140 through the diode 120 to the voltage supply terminal VDD. If ESD event occurs zapping from the pad 140 to the voltage supply terminal VSS, the parasitic capacitance Cgd2 formed between gate-overlapped drain capacitance in the N-Channel MOSFET transistor N1 can couple the ESD charges to develop voltage on the node NDN. Once this developed electrostatic voltage exceeds the threshold of the N-Channel MOSFET transistor N1, the N-Channel MOSFET transistor N1 is turned on to shunt ESD current. Clamping diodes 110 and 111 can be included in the ESD protection circuit 100 to provide discharge current paths from VSS to pad 140 and from pad 140 to VDD. The clamping diodes 110 and 111 are normally built from N-Channel MOSFET transistor and P-Channel MOSFET transistor with gate connected to its source.

The ESD protection circuit 100 includes several disadvantages. The parasitic diodes 120 and 121 in the ESD protection circuit 100 provide a passive ESD protection mechanism. No active circuit is present to detect an ESD event and turn on ESD protection devices. The current carrying capability of the diodes is proportional to the drawn area formed in its p-n junction. As the diodes are scaled down to sub-micro technologies, the diodes can only provide moderate ESD protection and is sometimes ineffective at all. Moreover, no logic controls are provided to keep the node PUP low and the node NDN high in response to the ESD zapping between VDD and the pad 140, and the pad 140 and VSS. That means that the transistors P1 and N1 may not be turned on in these ESD events to provide current ESD discharge paths from the supply terminal VDD to the pad 140 and the pad 140 to the supply terminal VSS in these ESD events. Additionally, the ESD protection circuit 100 is effective at the power up state during normal device operations. The output buffer 101 is normally disabled, meaning Hi-impedance state by default setting when the supply terminal VDD is powered-up in normal operation. The node PUP is normally at a high-voltage state and the P-Channel MOSFET transistor P1 is turned off.

Different conventional circuits for protecting the input and output buffers from ESD events include several disadvantages. Some conventional ESD protection circuits include clamping diodes to provide passive discharging current path. As the device is miniaturized to smaller scales, the clamping diodes can no longer provide ESD protection. As the gate oxide thickness reduces from 500 Å in 3 µm process technology to 16 Å in 0.13 µm process technology, the gate oxide layer becomes susceptible to damages by electrostatic charges. The clamping diodes in the conventional ESD protection circuits cannot be scaled to sub-micro scales. Moreover, the insertion of the clamping diodes also increases overall output buffer area. The clamping diodes in the conventional ESD protection circuits are usually implemented by N-Channel MOSFET and P-Channel MOSFET transistors. The sizes of the N-Channel MOSFET and P-Channel MOSFET transistors have to be very large for the transistors to provide enough current discharge as clamping diodes. The sizes of the transistors usually cannot scale with the reduced scale in the chip processing technologies.

Some conventional ESD protection circuits include high value resistor serially connected with the input/output buffer. A typical inserted resistor is in a range of several hundred ohms to several thousands ohms. A large resistor load like this can significantly reduce the driving capability and the switching frequency of the electronic device. These disadvantages become prevalent in high frequency and large driving current applications.

Furthermore, some conventional ESD protection circuits are disabled and cannot provide ESD protection when the electronic device is powered up. Some conventional ESD protection circuits may cause logic conflict at the output buffer, which can degrade the ESD protection circuitry. Some conventional ESD protection circuits only provide discharging path between a limited number of pad and supply terminals in restrictive directions.

SUMMARY

In a general aspect, the present invention relates to an electrostatic discharge protection circuit for an electronic device. The electrostatic discharge protection circuit includes an output buffer including a transistor having a gate configured to receive a control signal, a source connected to a voltage supply terminal, and a drain connected to a pad; and an ESD trigger circuit configured to produce a first electronic signal in response to an electrostatic voltage between the pad or the voltage supply terminal. The first electronic signal can isolate the control signal from the gate of the transistor and to turn on the transistor to discharge the electrostatic voltage between the pad and the voltage supply terminal.

In another general aspect, the present invention relates to an electrostatic discharge protection circuit for an electronic device. The electrostatic discharge protection circuit includes an output buffer including a P-Channel MOSFET transistor having a gate configured to receive a first control signal, a source connected to a first voltage supply terminal, and a drain connected to a pad; and an N-Channel MOSFET transistor having a gate configured to receive a second control signal, a source connected to a second voltage supply terminal, and a drain connected to the pad and the drain of the P-Channel MOSFET transistor. The electrostatic discharge protection circuit also includes an ESD trigger circuit configured to produce one or more first electronic signal in response to an electrostatic voltage between the pad and the first voltage supply terminal or the second voltage supply terminal, wherein the one or more first electronic signals are configured to isolate the first control signal from the gate of the P-Channel MOSFET transistor and to isolate the second control signal from the gate of the N-Channel MOSFET transistor, and the one or more first electronic signals are configured to turn on the P-Channel MOSFET transistor and the N-Channel MOSFET transistor to discharge the electrostatic voltage between the pad and the first voltage supply terminal or the second voltage supply terminal.

In yet another general aspect, the present invention relates to an electrostatic discharge protection circuit for an electronic device that includes an output buffer including a P-Channel MOSFET transistor having a gate configured to receive a first control signal, a source connected to a first voltage supply terminal, and a drain connected to a pad; and an N-Channel MOSFET transistor having a gate configured to receive a second control signal, a source connected to a second voltage supply terminal, and a drain connected to the pad and the drain of the P-Channel MOSFET transistor. The electrostatic discharge protection circuit also includes an ESD trigger circuit configured to produce one or more first electronic signal in response to an electrostatic voltage between the pad and the first voltage supply terminal or the second voltage supply terminal, wherein the one or more first electronic signals are configured to turn on the P-Channel MOSFET transistor and the N-Channel MOSFET transistor to discharge the electrostatic voltage between the pad and the first voltage supply terminal or the second voltage supply terminal. The electrostatic discharge protection circuit further includes a first transmission gate configured to isolate the first control signal from the gate of the P-Channel MOSFET transistor in response to the one or more first electronic signals; and a second transmission gate to isolate the second control signal from the gate of the N-Channel MOSFET transistor in response to the one or more first electronic signals.

Implementations of the system may include one or more of the following. The electrostatic discharge protection circuit can further include a transmission gate comprising one or more transistors, wherein the transmission gate is configured to isolate the control signal from the gate of the transistor in response to the first electronic signal. The transmission gate can transmit a logic state of the control signal to the gate of the transistor in response to a second electronic signal produced by the ESD trigger circuit. The second electronic signal can be produced by the ESD trigger circuit when a supply voltage is applied to the voltage supply terminal. The transistor can be an N-MOSFET transistor or a P-MOSFET transistor. The electrostatic discharge protection circuit can further include an ESD initiation circuit configured to allow electrostatic current to move from the pad to the voltage supply terminal, wherein ESD initiation circuit comprises an MOSFET transistor having a parasitic diode. The ESD trigger circuit can include a first inverter, a first feedback transistor having a gate connected with the output of the first inverter and a drain connected with the input of the first inverter, and a second feedback transistor having a gate connected with the output of the first inverter and a source connected with the input of the first inverter. The electrostatic discharge protection circuit can further include a resistor and a capacitor that are connected to an input to the first inverter and at least one of the resistor and the capacitor is connected with the voltage supply terminal. The electrostatic discharge protection circuit can further include a second inverter having an input connected to the output of the first inverter; and a third inverter having an input connected to the output of the second inverter and an output connected to the gate of the shunting transistor, wherein at least one of the second inverter or the third inverter can output the first electronic signal.

Embodiments may include one or more of the following advantages. The disclosed ESD protection circuit can provide effective ESD protection to an electronic device during the power-up period of the electronic device, which is not provided in some conventional ES protection devices. The power-up of the electronic device and an ESD event can be detected and distinguished by an ESD trigger circuit. The ESD trigger circuit can send different control signals to the discharging mechanism in the ESD protection circuit in accordance to the different situations. An effective ESD trigger circuit is also disclosed.

Effective ESD protection is provided to discharge electrostatic voltages between the pad and the VSS voltage supply terminal, between the VDD voltage supply terminal and the pad, and between the VDD voltage supply terminal and the VSS voltage supply terminal, which are not provided in some conventional ESD protection devices.

The disclosed ESD protection circuit can be scaled to sub-micron integrated circuit technologies while still providing effective ESD protection. The disclosed ESD protection circuit can include MOSFET transistors shared between an active discharging circuit and an output buffer, which minimizes the area of the output buffer.

Moreover, the disclosed ESD protection circuit can provide reliable active discharging of electrostatic charge from the VDD voltage supply terminal to a pad, which is not provided in some conventional ES protection devices. Furthermore, the disclosed ESD protection circuit can prevent logic fighting between control signals and the output buffer during an ESD event, which is a known problem in some conventional ES protection devices.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS the following drawings, which are incorporated in and form a part of the specification, illustrate embodiments of the present invention and, together with the description, serve to explain the principles of the invention.

DETAILED DESCRIPTION

Figure 1:
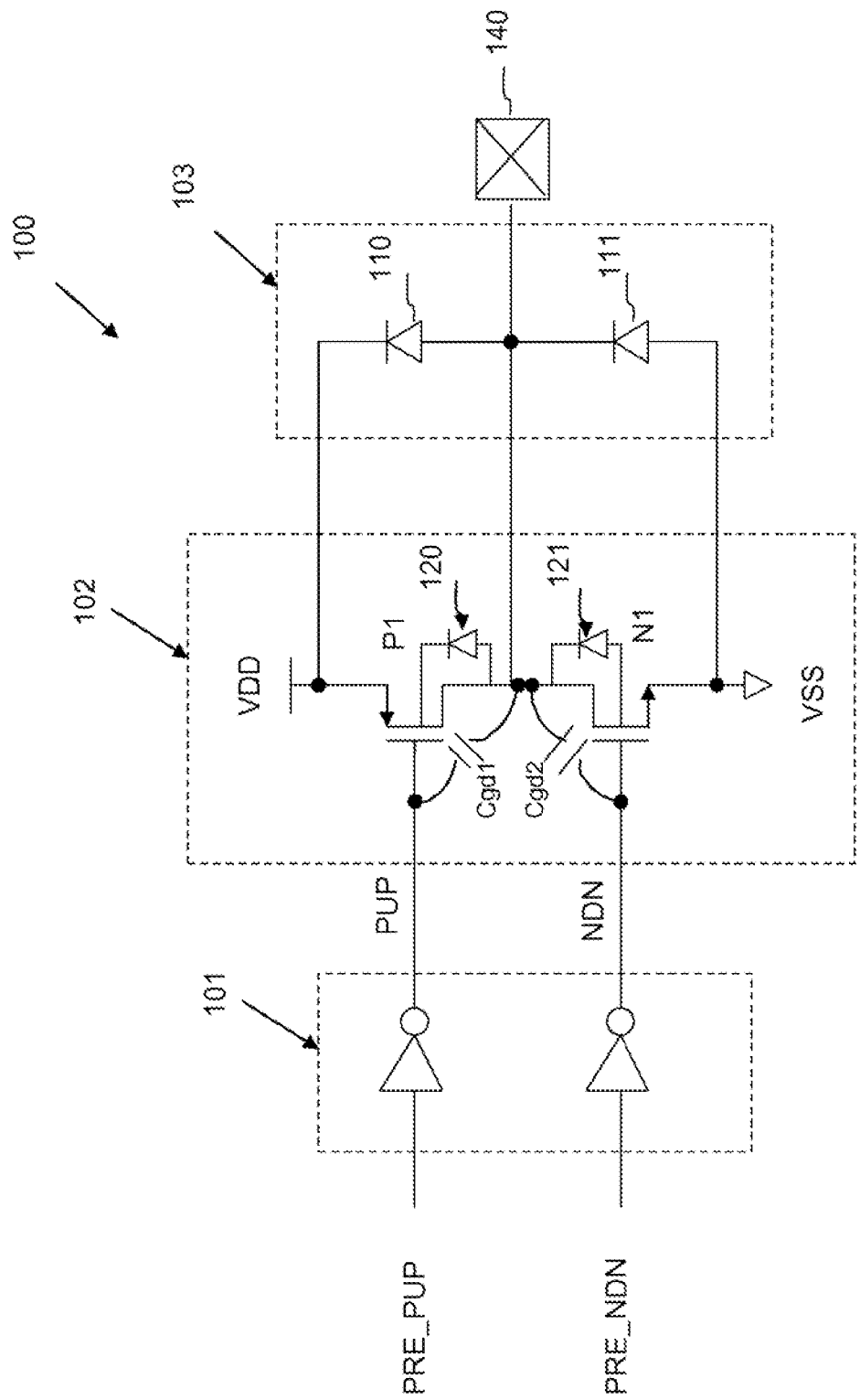
FIG. 1 is a schematic diagram of a conventional ESD protection circuit including an output buffer.
Figure 2:
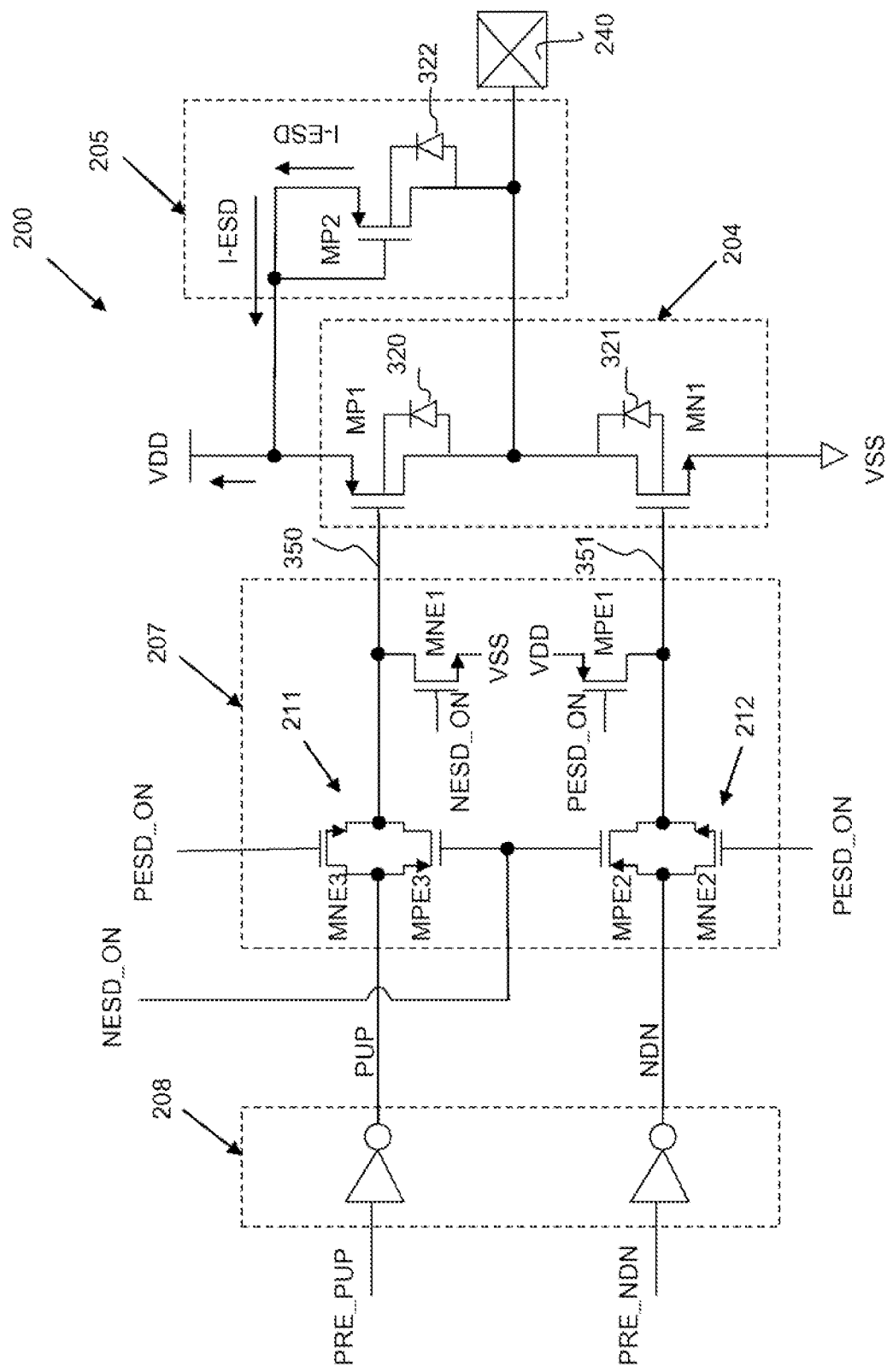
FIG. 2 is a schematic diagram of an ESD protection circuit in accordance with the present specification.
Figure 2:
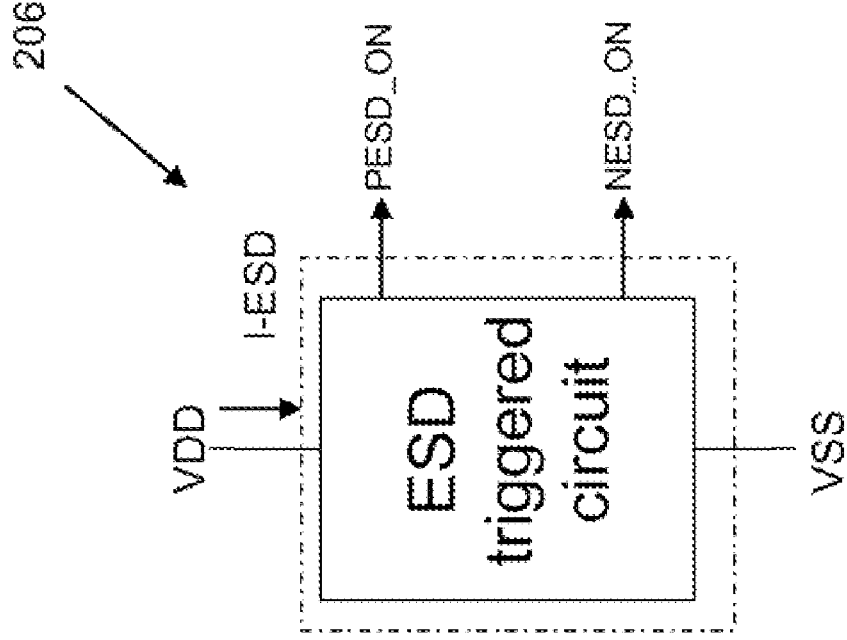

Referring to FIG. 2, an ESD protection circuit 200 includes an output buffer 204, an ESD trigger circuit 206, a pre-driver circuit 208, ESD initiation circuit 205, a circuit 207, and a pad 240. The output buffer 204 is connected with voltage supply terminals VDD and VSS and includes a P-Channel MOSFET transistor MP1 and an N-Channel MOSFET transistor MN1. The P-Channel MOSFET transistor MP1 includes parasitic diode 320. The N-Channel MOSFET transistor MN1 includes parasitic diode 321. Under the normal operation conditions when the electronic device is powered up (the VDD voltage supply terminal is at a supply a voltage), both the P-Channel MOSFET transistor MP1 and the N-channel MOSFET transistor MN1 have their drains connected to the pad 240. The source of the P-Channel MOSFET transistor MP1 is connected with the voltage supply terminal VDD. The source of the N-Channel MOSFET transistor MN1 is connected with the voltage supply terminal VSS. The gate (the node 350) of the P-Channel MOSFET transistor MP1 is connected with the output of the transmission gate 211 in the circuit 207. The gate (the node 351) of the N-Channel MOSFET transistor MN1 is connected with the output of the transmission gate 212 in the circuit 207.

The ESD protection circuit 200 can be part of an electronic device such as a chip device that can include a plurality of terminals or pins for signal input and output, voltage supplies, and a ground connection. The ESD protection circuit 200 to protect the electronic device from electrostatic charges at power-on state and power-off state. The power-on state can also be referred to as normal device operation.

The ESD initiation circuit 205 includes a P-Channel MOSFET transistor MP2 that includes a parasitic diode 322. The P-Channel MOSFET transistor MP2 and the parasitic diode 322 can forward ESD current "I-ESD" from the pad 240 to the VDD voltage supply terminal when a positive electrostatic voltage is establish from the pad 240 to the VDD voltage supply terminal. The function of ESD initiation circuit 205 is to provide voltage to voltage supply terminal VDD so the ESD trigger circuit 206 can be activated.

The circuit 207 includes a transmission gate 211 including MPE2/MNE2 and a transmission gate 212 including MPE3/MNE3. The transmission gates 211 and 212 are used to control the transmission of the control signals PUP and NDN (and thus PRE_PUP and PRE_NDN) to the inputs (i.e. the gates) of the P-Channel MOSFET transistor MP1 and the N-Channel MOSFET transistor MN1. The circuit 207 also includes control transistors MPE1 and MNE1 that are used to activate the discharging current paths in the P-Channel MOSFET transistor MP1 and the N-Channel MOSFET transistor MN1 during ESD events.

The pre-driver circuit 208 can convert drive signals form PRE_PUP and PRE_NDN to PUP and NDN. The ESD trigger circuit 206 is connected with voltage supply terminals VDD and VSS. The ESD trigger circuit 206 can detect an ESD event and output signals PESD_ON and NESD_ON during an ESD event. The signals PESD_ON and NESD_ON are used to control the transmission gates 211 and 212 and the control transistors MPE1 and MNE1 in the circuit 200 to discharge of the ESD current.

Figure 3:
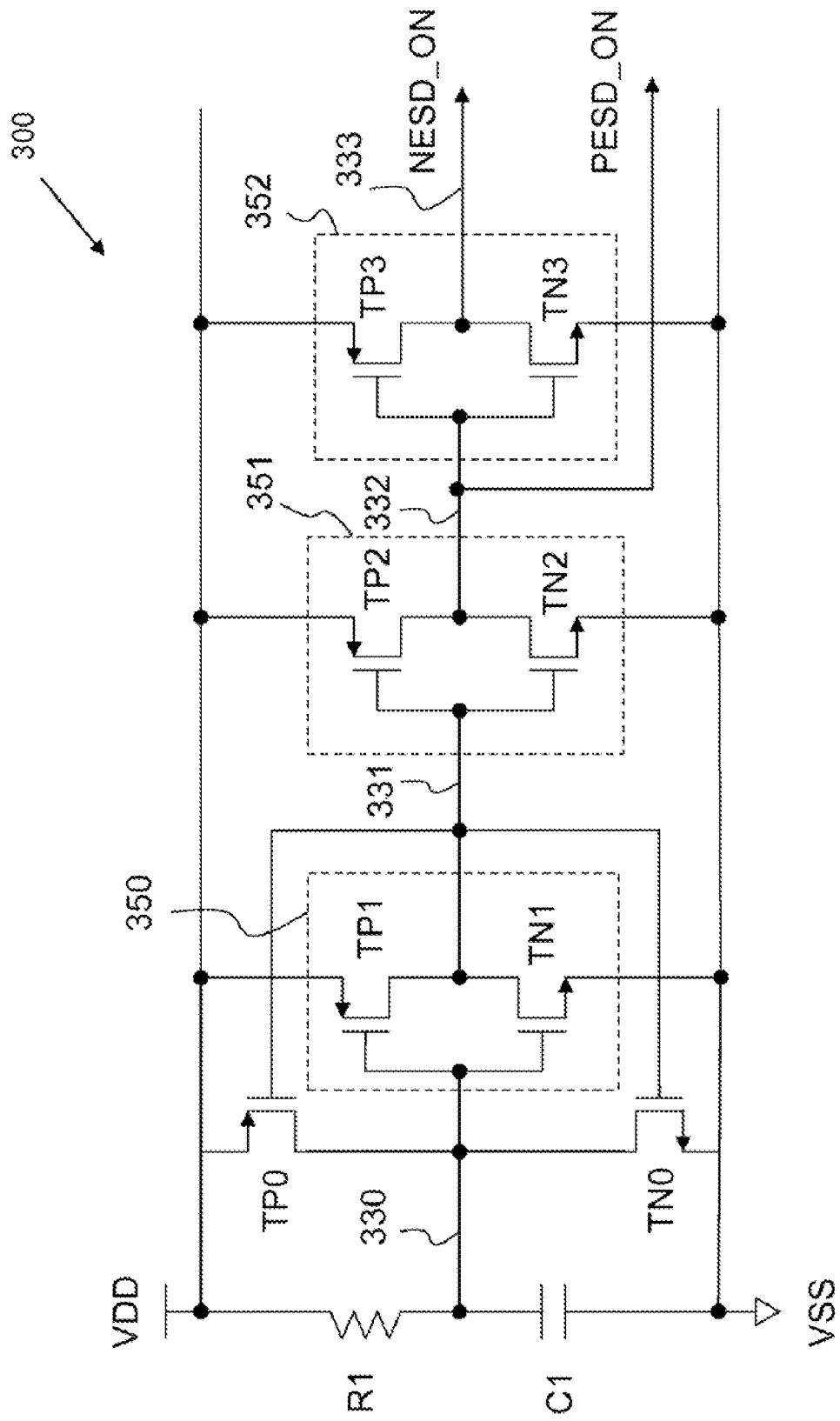
FIG. 3 is a schematic diagram of an exemplified ESD trigger circuit in FIG. 2.

FIG. 3 illustrates a circuit 300 as an example for ESD trigger circuit 206. The circuit 300 can include serially connected resistor R1 and a capacitor C1, three sequentially connected inverters 350, 351, and 352, and two feedback transistors TP0 and TN0 for the inverter 350. The transistors TP1, TN1, TP2, TN2, TP3, and TN3 in the inverters 350, 351, and 352 can be N-channel or P-Channel MOSFET transistors. Details about the operations of the circuit 300 are described in FIG. 7 and related discussions in the commonly assigned U.S. patent application Ser. No. 11/557,488, tilted "Improved electrostatic discharge protection circuit", filed Nov. 7, 2006, the disclosure of which is incorporated herein by reference.

The operations of the ESD protection circuit 200 are described below.

Normal Device Operations

The VDD voltage supply terminal is powered up from zero voltage to a supply voltage during normal device operations. VDD is normally a positive voltage such as 1.8V, 3.3V, or 5.0 V, depending on different process technologies. (VSS is normally negative or zero voltage.) The time from zero voltage to a supply voltage for the voltage supply terminal VDD is typically in the range of 1 micro second to milliseconds. The ESD trigger circuit 206 responds to such slow voltage rise differently from an ESD event. The ESD trigger circuit 206 can output an NESD_ON signal at a low voltage state and the PESD_ON signal at a high voltage state.

The low-voltage NESD_ON signal and the high-voltage PESD_ON signal can turn on the transmission gates 211 and 212. The logic levels of PRE_PUP and PRE_NDN are inverted by the pre-driver circuit 208. The output signals PUP and NDN are respectively passed by the transmission gates 211 and 212. The nodes 350 and 351 thus respectively have the opposite logic levels PRE_PUP and PRE_NDN. The low-voltage NESD_ON signal and the high-voltage PESD_ON signal can also turn off the transistors MNE1 and MPE1. In sum, the transistors MP1 and MN1 in the output buffer 204 can be controlled by the logic states of the PRE_PUP and PRE_NDN signals.

When the logic level PRE_PUP is high, the logic level at PUP is low, which turns on the P-Channel MOSFET transistor MP1. When the logic level PRE_NDN is low, the logic level at NDN is high, which turns on the N-Channel MOSFET transistor MN1.

The opposite logic levels at PRE_PUP and PRE_NDN can disable the output buffer 204. When the logic level PRE_PUP is low, the logic level at PUP is high, which turns off the P-Channel MOSFET transistor MP1. When the logic level PRE_NDN is high, the logic level at NDN is low, which turns off the N-Channel MOSFET transistor MN1. These two logic levels can thus shut off the MP1 and MN1 transistors, leaving the output pad 240 to be at a hi-impedance state.

In sum, the transmission gates 211 and 212 and P-Channel MOSFET transistor MPE1 and N-Channel MOSFET transistor MNE1 do not affect the operations of the output buffer 204 during normal device operations when a supply voltage is supplied to the VDD voltage supply terminal.

During an ESD Event

In one exemplified ESD event, an electrostatic voltage is formed between the pad 240 and the voltage supply terminal VSS as electrostatic charges accumulate on the pad 240. The electrostatic voltage can typically be established in a time range from 1 to 20 nanoseconds. An ESD current (I-ESD) can flow through the parasitic diode 322 to the VDD voltage supply terminal at a similar rate as the rise of the electrostatic voltage. The P-Channel MOSFET transistor MP2 is not required to be of large dimensions because only the initial ESD current flows through the parasitic diode 322. Once the ESD triggered circuit 206 is activated by the electrostatic voltage, the discharging current flows through the P-Channel MOSFET transistor MP1 to complete the discharging of electrostatic charges on the pad 240.

The ESD triggered circuit 206 can be activated by the rapid voltage rises at the VDD voltage supply terminal and output an NESD_ON signal at a high voltage state and the PESD_ON signal at a low voltage state. For example, all nodes in the circuit 300 are at near ground before an ESD event. When an electrostatic voltage rapidly establishes at the voltage supply terminal VDD, the transistor TP1 is turned on when the voltage between VDD and the node 330 passes a threshold, which brings node 331 to a high voltage state. The feedback transistor TN0 is turned on to keep the node 330 low. An inversion of the logic state at the node 331 by the inverter 351 gives a low-voltage PESD_ON signal. An inversion of a low-voltage PESD_ON signal by the inverter 352 gives a high-voltage NESD_ON signal. Details about the operations of the circuit 300 in response to an ESD event are described in the commonly assigned U.S. patent application Ser. No. 11/557,488, tilted "Improved electrostatic discharge protection circuit", filed Nov. 7, 2006, the disclosure of which is incorporated herein by reference.

The high-voltage NESD_ON signal and the low-voltage PESD_ON signal can shut off the transmission gates 211 and 212, thus isolating the output buffer 204 from the logic levels at the outputs PUP and NDN of from pre-driver circuit 208. The isolation of the output buffer 204 from the logic inputs to the pre-driver circuit 208 eliminates the possibility of logic conflicts in the ESD protection circuit 200.

The high-voltage NESD_ON signal and the low-voltage PESD_ON signal can also turn on the P-Channel MOSFET transistor MPE1 and N-Channel MOSFET transistor MNE1, which drives the voltage at node 350 to a low voltage state and the voltage at the node 351 to a high voltage state. As a result, the P-Channel MOSFET transistor MP1 and the N-Channel MOSFET transistor MN1 are both turned on. The ESD current can flow from the pad 240 to the VDD voltage supply terminal, and then to the VSS voltage supply terminal. The ESD current can also flow from the pad 240 to the VSS voltage supply terminal through the activated N-Channel MOSFET transistor MN1.

In another exemplified ESD event, an electrostatic voltage can be formed between the voltage supply terminal VDD and the pad 240 due to electrostatic charges accumulate on the pad 240. Similar to the previous example, the ESD voltage can arise in the range of 1 to 20 nanoseconds. Similar to described in the first example of ESD event, the ESD current (I-ESD) flowing through the ESD triggered circuit 206 can cause the ESD triggered circuit 206 to output a low-voltage PESD_ON signal and a high-voltage NESD_ON signal. The low-voltage PESD_ON signal and the high-voltage NESD_ON signal can shut off the transmission gates 211 and 212 and isolating the output buffer 204 from the pre-driver circuit 208, which can prevent logic fighting between the outputs of the pre-driver circuit 208 and the output buffer 204.

The high-voltage NESD_ON signal and the low-voltage PESD_ON signal can turn on the P-Channel MOSFET transistor MPE1 and the N-Channel MOSFET transistor MNE1, and also turn on both P-Channel MOSFET transistor MP1 and N-Channel MOSFET transistor MN1, which can shunt an ESD current from the VDD voltage supply terminal to the pad 240 through MP1. Furthermore, the activated MP1 and MN1 also provide a direct discharging path is also formed between VDD and VSS. It should be noted that the P-Channel MOSFET transistor MP1 and N-Channel MOSFET transistor MN1 in the output buffer 204 can also discharge to ESD current. The dual functions of the transistors MP1 and MN1 can thus save circuit area compared to the conventional ESD protection circuit.

In other ESD events, the electrostatic voltages between the pad 240 and the VDD voltage supply terminal can be discharged by the parasitic diode 320. The electrostatic voltages between the VSS voltage supply terminal and the pad 240 can be discharged by the parasitic diode 321. The electrostatic voltages between the VSS voltage supply terminal and the VDD voltage supply terminal can be discharged by the parasitic diodes 320 and 321.

The disclosed ESD protection circuit can include one or more of the following advantages. The disclosed ESD protection circuit can provide effective ESD protection to an electronic device during the power-up period of the electronic device. The power-up of the electronic device and an ESD event can be detected and distinguished by an ESD trigger circuit. The ESD trigger circuit can send different control signals to the discharging mechanism in the ESD protection circuit in accordance to the different situations. Effective ESD protection is provided to discharge electrostatic voltages between the pad and the VSS voltage supply terminal, between the VDD voltage supply terminal and the pad, and between the VDD voltage supply terminal and the VSS voltage supply terminal.

The disclosed ESD protection circuit can be scaled to sub-micron integrated circuit technologies while still providing effective ESD protection. The device areas can be reduced by sharing transistor components between disclosed ESD protection circuit and the output buffer. The disclosed ESD protection circuit includes active MOSFET transistors and associated parasitic diodes for discharging, which can be scaled down in dimensions in contrast to the passive discharging circuit that cannot be easily scaled down in some conventional ESD protection circuits.

Moreover, the disclosed ESD protection circuit can provide reliable active discharging of electrostatic charge from the VDD voltage supply terminal to a pad, which is not provided in some conventional ES protection devices. Furthermore, the disclosed ESD protection circuit can prevent logic fighting between control signals and the output buffer during an ESD event, which is a known problem in some conventional ES protection devices.

It should be understood that the disclosed electrostatic discharge protection circuit is not limited to the specific configurations described above. The disclosed electrostatic discharge protection circuit can be effectively applied to different types of device configurations and ESD testing methodologies. For example, the chip device can include different terminals such as digital input/output buffer pads, high voltage pad, VDD pad, VSS pad, a pad for crystal oscillator, a pad for high current I/O, and pads for differential input and output. Furthermore, the ESD trigger circuit can be implemented by different circuit designs as long as the circuit can detect ESD event and output signals at the appropriate logic levels as described above. For example, the ESD trigger circuit does not necessarily include a feedback circuit from the output the inverter 350 to the RC circuit.

What is claimed is:

1. An electrostatic discharge protection circuit for an electronic device, comprising:
    an output buffer comprising a transistor having a gate configured to receive a control signal, a source connected to a voltage supply terminal, and a drain connected to a pad; and
    an ESD trigger circuit configured to produce a first electronic signal in response to an electrostatic voltage between the pad and the voltage supply terminal, wherein the first electronic signal is configured to isolate the control signal from the gate of the transistor and to turn on the transistor to discharge the electrostatic voltage between the pad and the voltage supply terminal.

2. The electrostatic discharge protection circuit of claim 1, further comprising a transmission gate comprising one or more transistors, wherein the transmission gate is configured to isolate the control signal from the gate of the transistor in response to the first electronic signal.

3. The electrostatic discharge protection circuit of claim 1, wherein the transmission gate is configured to transmit a logic state of the control signal to the gate of the transistor in response to a second electronic signal produced by the ESD trigger circuit.

4. The electrostatic discharge protection circuit of claim 3, wherein the second electronic signal is produced by the ESD trigger circuit when a supply voltage is applied to the voltage supply terminal.

5. The electrostatic discharge protection circuit of claim 1, wherein the transistor is an N-MOSFET transistor or a P-MOSFET transistor.

6. The electrostatic discharge protection circuit of claim 1, further comprising an ESD initiation circuit configured to allow electrostatic current to move from the pad to the voltage supply terminal, wherein ESD initiation circuit comprises an MOSFET transistor having a parasitic diode.

7. The electrostatic discharge protection circuit of claim 1, wherein the ESD trigger circuit comprises:
a first inverter;
a first feedback transistor having a gate connected with the output of the first inverter and a drain connected with the input of the first inverter; and
a second feedback transistor having a gate connected with the output of the first inverter and a source connected with the input of the first inverter.

8. The electrostatic discharge protection circuit of claim 7, further comprising a resistor and a capacitor that are connected to an input to the first inverter and at least one of the resistor and the capacitor is connected with the voltage supply terminal.

9. The electrostatic discharge protection circuit of claim 7, further comprising:
a second inverter having an input connected to the output of the first inverter; and
a third inverter having an input connected to the output of the second inverter and an output connected to the gate of the shunting transistor, wherein at least one of the second inverter or the third inverter is configured to output the first electronic signal.

10. The electrostatic discharge protection circuit of claim 1, further comprising an ESD initiation circuit configured to allow electrostatic current to move from the pad to the first voltage supply terminal.

11. The electrostatic discharge protection circuit of claim 1, wherein the ESD trigger circuit comprises:
a first inverter;
a first feedback transistor having a gate connected with the output of the first inverter and a drain connected with the input of the first inverter; and
a second feedback transistor having a gate connected with the output of the first inverter and a source connected with the input of the first inverter.

12. The electrostatic discharge protection circuit of claim 11, further comprising a resistor and a capacitor that are connected to an input to the first inverter, wherein the resistor is connected with the first voltage supply terminal and the capacitor is connected with the second voltage supply terminal.

13. The electrostatic discharge protection circuit of claim 11, further comprising:
a second inverter having an input connected to the output of the first inverter; and
a third inverter having an input connected to the output of the second inverter and an output connected to the gate of the shunting transistor, wherein the second inverter or the third inverter are configured to output the one or more first electronic signals.

14. An electrostatic discharge protection circuit for an electronic device, comprising:
an output buffer comprising:
a P-Channel MOSFET transistor having a gate configured to receive a first control signal, a source connected to a first voltage supply terminal, and a drain connected to a pad; and
an N-Channel MOSFET transistor having a gate configured to receive a second control signal, a source connected to a second voltage supply terminal, and a drain connected to the pad and the drain of the P-Channel MOSFET transistor; and
an ESD trigger circuit configured to produce one or more first electronic signal in response to an electrostatic voltage between the pad and the first voltage supply terminal or the second voltage supply terminal, wherein the one or more first electronic signals are configured to isolate the first control signal from the gate of the P-Channel MOSFET transistor and to isolate the second control signal from the gate of the N-Channel MOSFET transistor, and the one or more first electronic signals are configured to turn on the P-Channel MOSFET transistor and the N-Channel MOSFET transistor to discharge the electrostatic voltage between the pad and the first voltage supply terminal or the second voltage supply terminal.

15. The electrostatic discharge protection circuit of claim 14, further comprising:
a first transmission gate configured to isolate the first control signal from the gate of the P-Channel MOSFET transistor in response to the one or more first electronic signals; and
a second transmission gate to isolate the second control signal from the gate of the N-Channel MOSFET transistor in response to the one or more first electronic signals.

16. The electrostatic discharge protection circuit of claim 14, wherein the first transmission gate is configured to transmit a logic state of the first control signal to the gate of the P-Channel MOSFET transistor in response to a second electronic signal produced by the ESD trigger circuit.

17. The electrostatic discharge protection circuit of claim 16, wherein the second electronic signal is produced by the ESD trigger circuit when a supply voltage is applied to the voltage supply terminal.

18. The electrostatic discharge protection circuit of claim 14, wherein the second transmission gate is configured to transmit a logic state of the second control signal to the gate of the P-Channel MOSFET transistor in response to a second electronic signal produced by the ESD trigger circuit.

19. The electrostatic discharge protection circuit of claim 18, wherein the second electronic signal is produced by the ESD trigger circuit when a supply voltage is applied to the voltage supply terminal.

20. An electrostatic discharge protection circuit for an electronic device, comprising:
   an output buffer comprising:
      a P-Channel MOSFET transistor having a gate configured to receive a first control signal, a source connected to a first voltage supply terminal, and a drain connected to a pad; and
      an N-Channel MOSFET transistor having a gate configured to receive a second control signal, a source connected to a second voltage supply terminal, and a drain connected to the pad and the drain of the P-Channel MOSFET transistor;
   an ESD trigger circuit configured to produce one or more first electronic signal in response to an electrostatic voltage between the pad and the first voltage supply terminal or the second voltage supply terminal, wherein the one or more first electronic signals are configured to turn on the P-Channel MOSFET transistor and the N-Channel MOSFET transistor to discharge the electrostatic voltage between the pad and the first voltage supply terminal or the second voltage supply terminal;
   a first transmission gate configured to isolate the first control signal from the gate of the P-Channel MOSFET transistor in response to the one or more first electronic signals; and
   a second transmission gate to isolate the second control signal from the gate of the N-Channel MOSFET transistor in response to the one or more first electronic signals.

* * * * *